United States Patent [19]
Hillman

[11] Patent Number: 6,126,380
[45] Date of Patent: Oct. 3, 2000

[54] ROBOT HAVING A CENTERING AND FLAT FINDING MEANS

[75] Inventor: Gary Hillman, Livingston, N.J.

[73] Assignee: Creative Design Corporation, Montville, N.J.

[21] Appl. No.: 09/128,790

[22] Filed: Aug. 4, 1998

Related U.S. Application Data

[60] Provisional application No. 60/054,694, Aug. 4, 1997, and provisional application No. 60/065,995, Nov. 14, 1997.

[51] Int. Cl.[7] .................................................. H01L 21/68
[52] U.S. Cl. ........................ 414/744.6; 414/754; 414/936; 414/800
[58] Field of Search ..................................... 414/935, 936, 414/754, 784, 744.6, 780

[56] References Cited

U.S. PATENT DOCUMENTS

| | | | |
|---|---|---|---|
| 4,770,590 | 9/1988 | Hugues et al. ........................... | 414/172 |
| 4,887,904 | 12/1989 | Nakazato et al. ........................ | 414/754 |
| 5,102,280 | 4/1992 | Poduje et al. ......................... | 414/744.6 |
| 5,474,410 | 12/1995 | Ozawa et al. ........................... | 414/754 |
| 5,504,345 | 4/1996 | Bartunek et al. ....................... | 414/936 |

FOREIGN PATENT DOCUMENTS

| | | | |
|---|---|---|---|
| 63-169040 | 7/1988 | Japan .................................... | 414/936 |

*Primary Examiner*—Gregory A. Morse
*Attorney, Agent, or Firm*—Lerner, David, Littenberg, Krumholz & Mentlik, LLP

[57] ABSTRACT

The present invention is a wafer handling robot which does not require a second mechanism for performing the task of pre-alignment. The robot uses the moving elements of the wafer handling robot which perform the wafer handling tasks to perform the tasks of centering and notch or flat finding of a wafer.

13 Claims, 5 Drawing Sheets

ROBOT HAVING A CENTERING AND FLAT FINDING MEANS

The present application claims the benefit of U.S. Provisional Pat. Application Ser. No. 60/054,694, filed on Aug. 4, 1997, and U.S. Provisional Pat. Application Ser. No. 60/065,995, filed on Nov. 14, 1997, the disclosures of which are hereby incorporated by reference herein.

BACKGROUND OF THE INVENTION

The present invention is directed to a wafer handling robot. In particular, it relates to a wafer handling robot which performs the task of centering and notch or flat finding, commonly referred to as pre-alignment.

Wafers used in the semiconductor industry are disks of semiconductor material with a generally circular shape having a straight edge referred to as the "flat"or "notch"interrupting the circular edge at one location. Some wafers have two distinct flats or notches interrupting the circular edge. Typically, wafers are transported and handled by wafer handling robots, so as to minimize contact of the wafer with contaminants. When handling a wafer, it is important to know where the center of the wafer is and where the flat of the wafer is located in relation to the components of the handling apparatus. This information, acquired in a step commonly called "pre-alignment,"allows the wafer handling robot to properly place the wafer in a desired location. Pre-aligning the wafer also enables the wafer handling robot to avoid bringing the wafer into contact with any objects during transportation and placement of the wafer.

Such wafer handling robots are typically polar coordinate robots having three axes of movement along which the robot can operate. These axes include a vertical axis Z, a rotational axis theta and at least one radial axis R. In typical wafer handling robots, an extra moving element movable along at least one additional axis is necessary to perform the pre-alignment task. Thus, a second mechanism is necessary to perform pre-alignment of the wafer. The use of a second mechanism to perform pre-alignment of the wafer increases both the size and cost of the system, and can result in additional handling of the wafer which can result in the wafer coming into contact with increased amounts of contaminants.

SUMMARY OF THE INVENTION

One aspect of the present invention provides a wafer handling robot which does not require a second mechanism for performing the task of pre-alignment. Preferred robots according to this aspect of the invention use the moving elements of the wafer handling robot which perform the wafer handling tasks to perform the tasks of centering and notch or flat finding.

The robot has been designed to incorporate sufficient intelligence and hardware to eliminate the need for a separate pre-alignment capability. The robot is a cylindrical coordinate robot, having a vertical axis Z, a rotational axis theta and at least one radial axis R. The robot uses these degrees of freedom to perform the task of centering and notch or flat finding as well as the task of pre-alignment.

One aspect of the present invention provides a cylindrical coordinate robot for performing the task of centering and notch or flat finding of a wafer as well as the task of pre-alignment. The cylindrical coordinate robot includes a frame, at least one hand operatively mounted to the frame, a chuck having a vertical axis mounted to the frame, and means for moving at least one of the hands and the chuck relative to the frame so that the hand either places a wafer on the chuck or removes a wafer from the chuck and so that the hand moves relative to the chuck in a circumferential direction also referred to as the "theta"direction around the vertical axis of the chuck while a wafer is disposed on the chuck. The robot further includes a sensor attached to the hand for detecting the radial position of the wafer edge at various circumferential positions about the vertical axis of the chuck. Such robot uses the movement of the hand to both place the wafer and to determine the position of the wafer on the chuck.

The means for moving may include means for moving the hand relative to the frame so that the hand orbits around the vertical axis of the chuck in the theta direction while the chuck does not rotate around said vertical axis The means for moving the hand may further include means for moving said hand in radial or R directions towards or away from the vertical axis of the chuck while the hand is in each of a plurality of circumferential positions relative to the chuck. Typically, the chuck, the hand or both are also movable in the vertical or Z direction, parallel to the vertical axis.

In addition, the sensor attached to the hand may include a detector mounted to the hand at a detector location and operative to detect presence of an edge of the wafer at such a detector location and provide an edge signal when the detector location is radially aligned with the edge. For example, the detector may include a photodetector such as a photodiode or phototransistor, mounted to the arm so that light input to the photodetector is occluded by the wafer when the photocell is aligned with the wafer. An electrical property of the photodetector such as its impedance or a voltage produced by the detector has one value when the photodetector is occluded by the wafer and a different value when the detector is not occluded. The change in the electrical property of the detector constitutes the edge signal. The robot may further include means for tracking the radial position of the hand and determining the radial position of the edge based on the radial position of the hand when the edge signal is generated.

In an alternate embodiment of the invention, the cylindrical coordinate robot includes means for rotating the chuck relative to the frame around the vertical axis to thereby position the arm at different circumferential positions relative to the chuck. The robot of this embodiment may further include means for moving said hand in radial directions towards or away from the vertical axis while the hand is in each of a plurality of circumferential positions relative to the chuck. The sensor in this embodiment may include a detector as discussed above mounted to the hand at a detector location and operative to detect the presence of an edge of the wafer at such detector location and provide an edge signal when the detector location is radially aligned with the edge. The sensor may further include means for tracking the radial position of the hand and determining the radial position of the edge based on the radial position of said hand when said edge signal is generated.

The hand of the preferred embodiment of the robot may comprise a base and at least two fingers attached to the base. The sensor of the preferred embodiment of the invention may detect the radial position of the wafer edge at 60° intervals. In addition, the sensor of such preferred embodiment may include a light emitting diode, photo transistor couple.

A preferred embodiment of a method for finding the center of the wafer includes the steps of using a robot hand to place the wafer on a chuck, detecting the radial position of the wafer edge at various circumferential positions about a vertical axis through a sensor disposed on the robot hand, and calculating the location of the center of the wafer relative to the vertical axis based on said detected radial positions.

The method may include the further step of determining the location of a notch or flat of the wafer by using the sensor to detect edges of the wafer. In addition, the method may also include the step of using the hand to align the calculated center of the wafer with the vertical axis prior to the step of determining the location of the notch or flat of the wafer. In this embodiment of the method the step of using the sensor to detect edges of the wafer may also include the step of positioning the sensor at a radial distance from the vertical axis and moving the sensor circumferentially around the vertical axis so that the sensor detects edges of the wafer.

In addition, the method may further include the step of transporting the wafer away from the chuck to a desired location.

BRIEF DESCRIPTION OF THE DRAWINGS

FIG. 1 is a perspective view depicting a wafer handling robot according to one embodiment of the present invention, with.

DETAILED DESCRIPTION OF THE PREFERRED EMBODIMENTS

Figure 1:
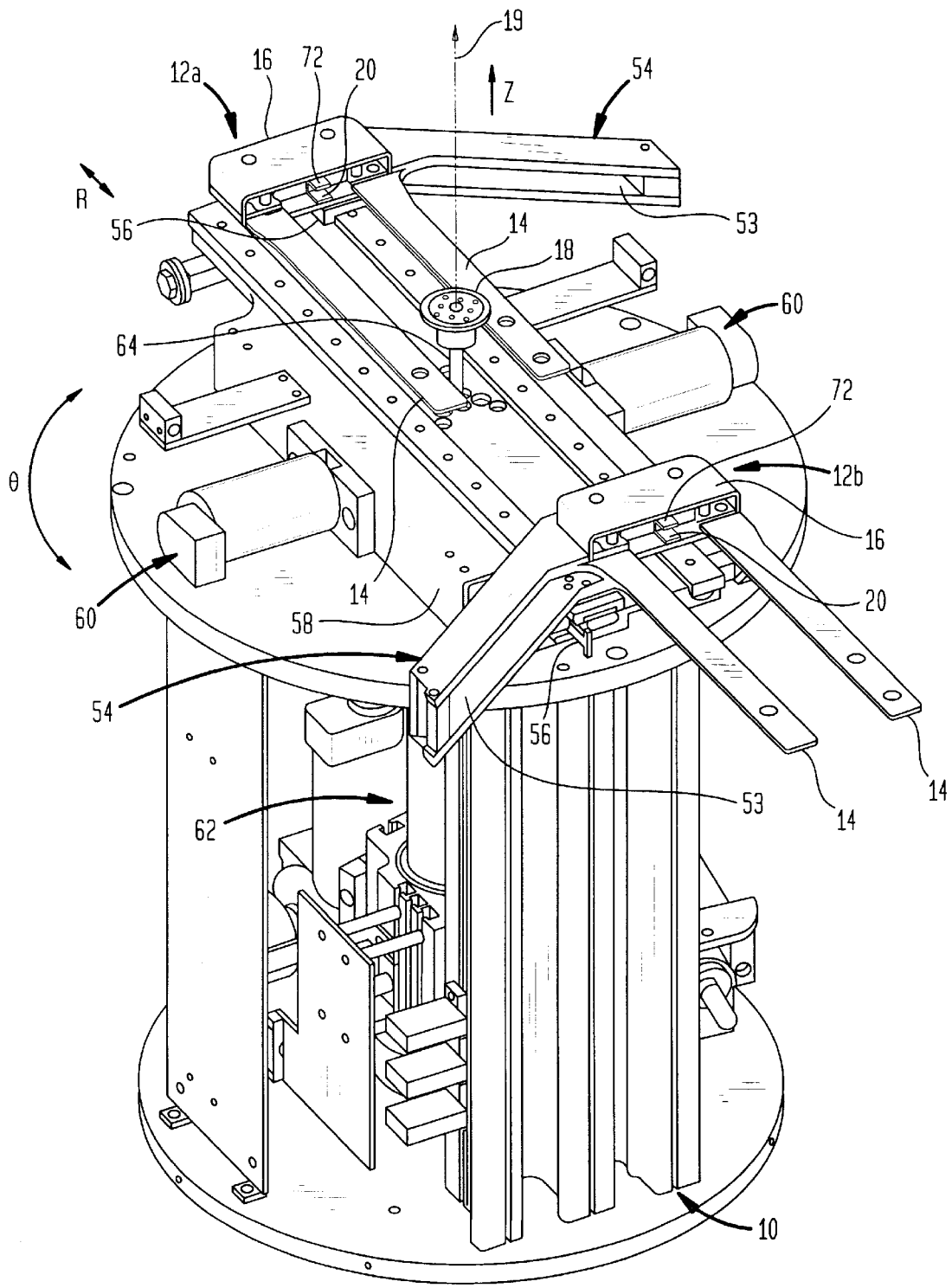
Figure 2:
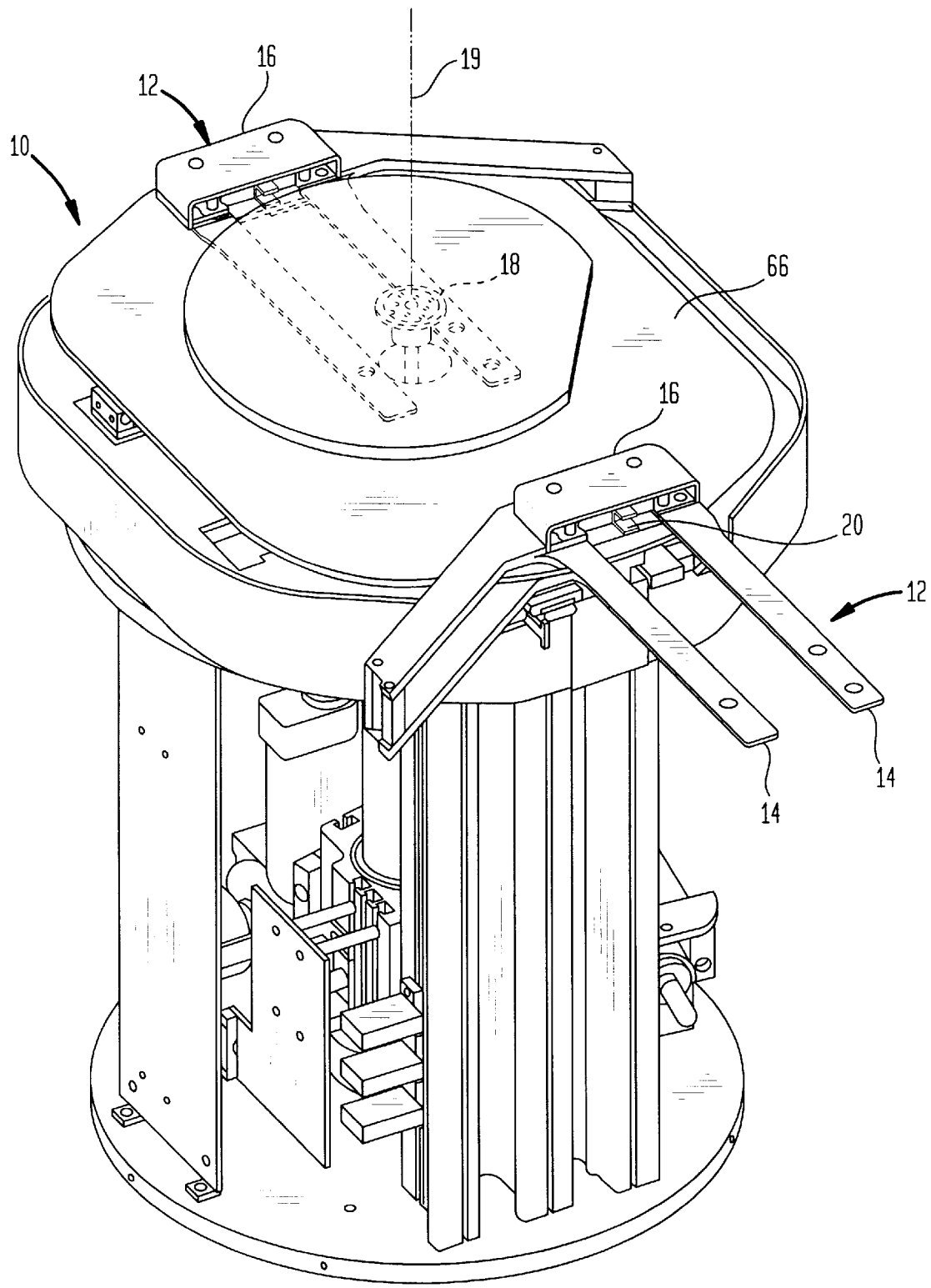
FIG. 2 is a perspective view of the wafer handling robot of FIG. 1 in conjunction with a wafer.

FIGS. 1 and 2 show the general layout of a wafer handling robot in accordance with one embodiment of the present invention. The robot includes a frame 10 two hands 12 and a chuck 18 having a vertical axis 19 extending through it. Each hand is mounted on an arm 54 which in turn is mounted on a slide 56. Each arm includes a pair of cantilever beams disposed one above the other, with a gap 53 between such beams. The slides associated with both hands are slidably mounted on a carriage 58 for movement along carriage 58 in the radial direction R. A radial actuator 60 is associated with each slide 56. Each radial actuator 60 includes a servomotor which is connected by cables to the associated slide 56, so that each radial actuator can drive the associated slide 56 along carriage 58 in radial directions R, towards and away from the vertical axis. Each radial actuator 60 further includes a conventional position encoding components which provide a signal representing the radial position of the associated hand 12. A rotation and elevation drive unit 62, which includes servomotors and conventional mechanical components for linking the servomotors to the carriage is also mounted to frame 10 for turning carriage 58 in circumferential directions theta around vertical axis 19, thereby swinging the hands 12 around the vertical axis, and for raising and lowering the carriage, and hence the hands, in the vertical or z direction parallel to axis 19. Drive unit 62 also provides signals representing the theta or rotational position of the carriage, and hence the theta or rotational position of hands 12, as well as the vertical or z-direction position of the carriage and hands. Chuck 18 is mounted to the frame by a shaft 64, which is fixed against rotation on axis 19. As best seen in FIG. 2, a cover 66 is disposed beneath chuck 18, and isolates the aforementioned mechanisms from the chuck and from any wafer positioned thereon. The gaps 53 in arms provide clearance for the cover 66.

Each robot hand 12 includes two fingers 14 connected to a base 16, which in turn is mounted to the associated arm 54. Each arm also has a sensor 20 mounted to the base 16 of the arm. Each sensor 20 is a photodetector, preferably a phototransistor, adapted to detect light directed along a detector axis disposed at a fixed location on the hand. A light source 72, desirably a light emitting diode, is mounted to each hand 12 above the photodetector 20 for directing light along the detector axis toward the photodetector. The photodetectors 20, as well as the servomotors and position encoding devices of radial drive unit 60 and of rotation and elevation drive unit 62 are connected to a control computer 74, which may be a conventional programmable computer. Conventional interfacing devices (not shown) are provided for connecting the computer to the other elements of the system. Thus, the computer can actuate the hands to move circumferentially (theta) about vertical axis 19; to move radially towards and away from the axis (R) and to move vertically (z). The computer is provided with data representing the position of the hands in all of these degrees of freedom. The data representing the radial and circumferential position of each hand also represents the radial and circumferential position of the photodetector 20 associated with each hand. At the same time, computer 74 is also provided with a signal from the photodetector 20 of each hand, indicating whether that photodetector 20 is or is not occluded by a wafer.

In operation, computer 74 actuates the servomechanisms to move the hands so as to place wafers onto the chuck 18. In the condition depicted in FIG. 2, a wafer W has been positioned on chuck 19 by hand 12a, whereas the other hand 12b is momentarily idle. Wafer W is a conventional wafer, generally in the form of a circular disc with a center C and with a flat F at one location on the circumference of the disc. During placement, hand 12a is brought to the radial position illustrated and then lowered so as deposit the wafer W on the chuck with the center C of the wafer close to the vertical axis 19. The inclusion of a second hand permits two wafers to be resident on the robot which permits the exchange of wafers to the source from which the wafers were received, typically, a cassette, in an absolute minimum of time.

After hand 12a has placed the wafer on the chuck, the rotation and elevation mechanism is actuated to rotate the hands 12 about the axis 19. While rotating one of the hands 12 about the axis of the chuck 18, the robot 10 uses sensor 20 on the hand 12 to detect the radial position of the wafer edge at various circumferential positions about the axis of the chuck 18. The robot positions hand 12a at six circumferential positions about the vertical axis 19. At each circumferential position, the robot moves hand 12a radially, thereby moving the photodetector 20 and the associated light source 72 radially. When the photodetector reaches an edge of the wafer while moving radially inwardly, the wafer will occlude the photodetector and the signal will change, representing a change from an unoccluded condition to an occluded condition. The opposite change occurs during radially outward movement of the hand. Computer 74 records the radial location of the sensor where the edge is detected for each of the six circumferential positions. This data thus denotes the position of the wafer edge in the frame of reference of the robot. This data gathering operation is conducted using the same hand and hand movement devices as are used to place the wafer on the chuck; no additional moving element is required.

The data recorded by computer 74 is used by the computer to determine the location of the center C of the wafer in the frame of reference of the robot.

In a preferred embodiment of the invention, the computer 74 uses a method of least squares to find a best circle to fit the detected radial positions of the wafer edge measured by the measurement devices 20. The least squares method can be applied to any given number of radial positions of the wafer numbering 4 or more. As the best fit is the one used for determining the center, any measurement taken on a flat or a notch is discarded as less than the best.

In the preferred embodiment of the invention discussed above, the measurement devices 20 detect the radial position of the wafer edge at 60° intervals.

Figure 3:
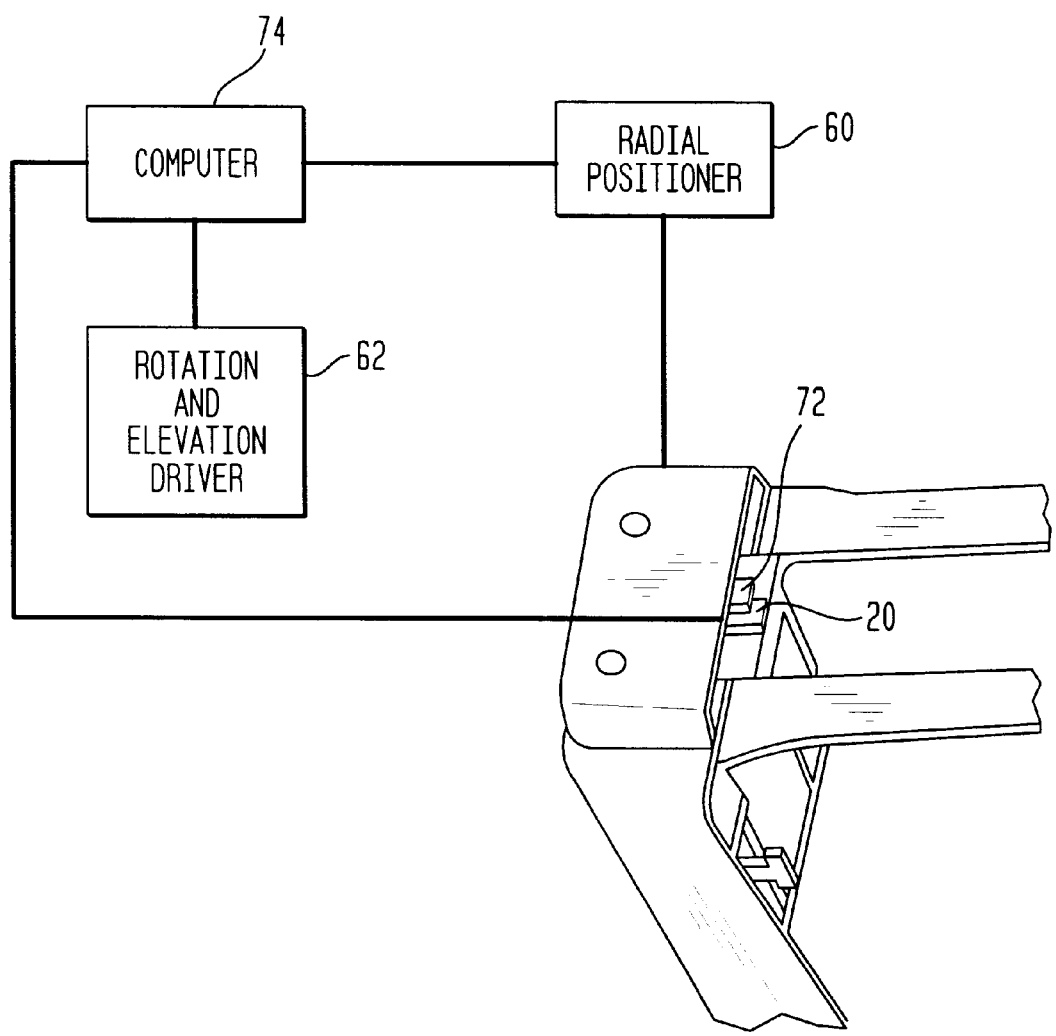
FIG. 3 is a block diagram depicting certain elements of the wafer handling robot shown in FIGS. 1 and 2.
Figure 4:
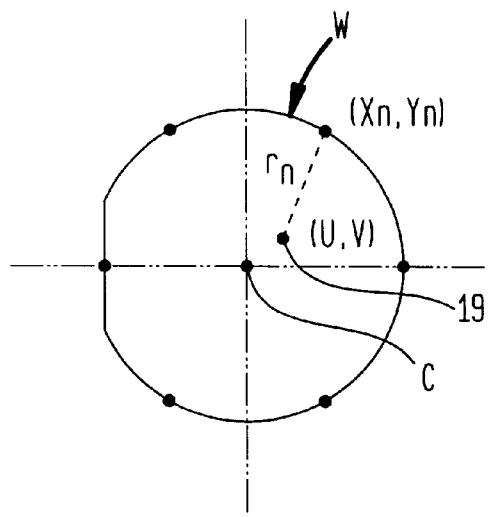
FIG. 4 is a diagram representation of the Cartesian coordinates utilized by the wafer handling robot of FIGS. 1–3 to locate the center of a wafer.

Since the angle between measurements is 60° and the largest included angle for a flat including center offset is 52° and the number of flats on a standard wafer will never exceed 2, if follows that 4 points will always be sufficient to find the true center. The least squares method and associated calculations performed by the robot 10 are illustrated in the following example:

The nth radial position of the wafer is specified by its Cartesian coordinates (xn, yn) relative to any convenient system of rectangular Cartesian coordinates for the plane of the wafer. (See FIG. 3). The robot 10 selects an arbitrary radial position with Cartesian coordinates (U, V) which is to be considered as a possible candidate for the best center for the N detected radial positions of the wafer. The distance rn from (U, V) to the nth given point (xn, yn) is determined by the Pythagorean equation, $$r_m^2 = (x_m - U)^2 + (y_m - V)^2 \quad (1)$$

The square, sn, of the distance rn is then determined, by the following equation, $$s_m = r_m^2 \quad (2)$$

so that equation (1) can be expressed as:

$$s_m = (x_m - U)^2 + (y_m - V)^2 \quad (3)$$

Equation (3) is then expanded to put it into the form:

$$s_m = U^2 + V^2 - 2Ux_m - 2Vy_m + x_m^2 + y_m^2 \quad (4)$$

Equation (4) is summed over n (from n=1 to n=N) and the result is divided by N to effectively average each term in the equation over n. This yields the result:

$$\frac{1}{N}\sum_{n=1}^{N} s_n = U^2 + V^2 - \frac{2U}{N}\sum_{n=1}^{N} x_n - \frac{2V}{N}\sum_{n=1}^{N} y_n + \frac{1}{N}\sum_{n=1}^{N} x_n^2 + \frac{1}{N}\sum_{n=1}^{N} y_n^2 \quad (5)$$

Each of the five indicated averages that involve summations in the above equation are determined by the given coordinate data xn and yn, so the above averages are given convenient abbreviations to clean up the appearance of the equation. The abbreviations to be used are as follows:

$$S = \frac{1}{N}\sum_{n=1}^{N} s_n, \quad (6)$$

$$X_1 = \frac{1}{N}\sum_{n=1}^{N} x_n, \quad (7)$$

$$Y_1 = \frac{1}{N}\sum_{n=1}^{N} y_n, \quad (8)$$

$$X_2 = \frac{1}{N}\sum_{n=1}^{N} x_n^2, \quad (9)$$

$$Y_2 = \frac{1}{N}\sum_{n=1}^{N} y_n^2, \quad (10)$$

Inserting the above abbreviations into equation (5) yields:

$$S = U^2 + V^2 - 2UX_1 - 2VY_1 + X_2 + Y_2, \quad (11)$$

This gives the means square distance, S, of the N detected radial positions of the wafer from the arbitrarily chosen point (U, V). Additional similar abbreviations to be used below are:

$$X_3 = \frac{1}{N}\sum_{n=1}^{N} x_n^3, \quad (12)$$

$$Y_3 = \frac{1}{N}\sum_{n=1}^{N} y_n^3, \quad (13)$$

$$Z_1 = \frac{1}{N}\sum_{n=1}^{N} (x_n y_n), \quad (14)$$

$$Z_2 = \frac{1}{N}\sum_{n=1}^{N} (x_n^2 y_n), \quad (15)$$

$$Z_3 = \frac{1}{N}\sum_{n=1}^{N} (x_n y_n^2), \quad (16)$$

Equation (11) is subtracted from equation (4) to evaluate the deviation of sn from the mean-square distance S for all of the sn values:

$$(s_m - S) = -2U(x_m - X_1) - 2V(y_m - Y_1) + (x_m^2 - X_2 + y_m^2 - Y_2) \quad (17)$$

Equation (17) is then squared to compute the square of the deviation (sn−S), which yield:

$$(s_m - S)^2 + 4U^2(x_m^2 - 2x_m X_1 + X_1^2) + 4V^2(Y_m^2 - 2y_m Y_1 + Y_1^2) +$$
$$8UV(x_m y_m - x_m Y_1 - y_m X_1 + X_1 Y_1) - 4U(x_m - X_1)(x_m^2 - X_2 + y_m^2 - Y_2) -$$
$$4V(y_m - Y_1)(x_m^2 - X_2 + y_m^2 - Y_2) + (x_m^2 - X_2 + y_m^2 - Y_2)^2 \quad (18)$$

Equation (18) is then summed over n (from n=1 to n=N), the result is divided by N, and abbreviations (7)–(10) and (14) are inserted to obtain:

$$\frac{1}{N}\sum_{n=1}^{N} (s_n - S)^2 = 4U^2(X_2 - X_1^2) + 4V^2(Y_2 - Y_1^2) + \quad (19)$$
$$8UV(Z_1 - X_1 Y_1) -$$

-continued $$4U\frac{1}{N}\sum_{n=1}^{N}[(x_n - X_1)(x_n^2 - X_2 + y_n^2 - Y_2)] -$$

$$4V\frac{1}{N}\sum_{n=1}^{N}[(y_n - Y_1)(x_n^2 - X_2 + y_n^2 - Y_2)] +$$

$$\frac{1}{N}\sum_{n=1}^{N}(x_n^2 - X_2 + y_n^2 - Y_2)^2$$

The left hand side of equation (19) expresses the statistical variance of the N different S values (statistical variance of the squares of the distances rn between the N given points and their putative center (U, V)) and is therefore of great importance in judging the fitness of the point (U, V) as a center. Whatever point (U, V) is judged as the best center for the N given points must minimize the variance expressed by the left hand side of equation (19). Thus, it is convenient to assign "var(s)" to the left side of equation (19):

$$\text{var}(s) = \frac{1}{N}\sum_{n=1}^{N}(s_n - S)^2. \tag{20}$$

In addition, it is convenient to expand the summands of the first two summations on the right hand side of equation (19) and to use abbreviations (7)–(10) and (12)–(16) to express equation (19) as follows:

$$\text{var}(s) = 4U^2(X_2 - X_1^2) + 4V^2(Y_2 - Y_1^2) + \tag{21}$$
$$8UV(Z_1 - X_1Y_1) - 4U(X_3 - X_1X_2 + Z_3 - X_1Y_2) -$$
$$4V(Y_3 - Y_1Y_2 + Z_2 - X_2Y_1) + \frac{1}{N}\sum_{n=1}^{N}(x_n^2 - X_2 + y_n^2 - Y_2)^2$$

Equation (21) permits var(s) to be evaluated explicitly from only given the given position data (xn, yn) and the values chosen for the coordinates U and V of the putative center point. To minimize var(s) by suitable choice of U and V, the conditions for such a minimum are that the partial derivatives of var(s) with respect to U and V shall vanish. As the final summation indicated in equation (21) is not dependent on either U or V, it does not contribute to the partial derivatives in question, and drops out of the equation. After division by a factor of 8, the equations that express the vanishing of the partial derivatives of var(s) with respect to U and V based on equation (21) are:

$$U(X_2-X_1^2)+V(Z_1-X_1Y_1)=\tfrac{1}{2}(X_3-X_1X_2+Z_3-X_1Y_2), \tag{22}$$

and $$U(Z_1-X_1Y_1)+V(Y_2-Y_1^2)=\tfrac{1}{2}(Y_3-Y_1Y_2+Z_2-X_2Y_1), \tag{23}$$

It then becomes convenient to introduce the following abbreviations representing quantities which are easily computed from earlier data:

$$Q_1=(X_2-X_1^2), \tag{24}$$

$$Q_2=(Y_2-Y_1^2), \tag{25}$$

$$Q_3=(Z_1-X_1Y_1), \tag{26}$$

$$K_1=\tfrac{1}{2}(X_3-X_1X_2+Z_3-X_1Y_2), \tag{27}$$

$$K_2=\tfrac{1}{2}(Y_3-Y_1Y_2+Z_2-X_2Y_1), \tag{28}$$

$$D=(Q_1Q_2-Q_3^2), \tag{29}$$

Substituting these abbreviations into equations (22) and (23) yields a simple pair of simultaneous linear equations for the quantities U and V, namely:

$$Q_1U+Q_3V=K_1, \tag{30}$$

and $$Q_3U+Q_2V=K_2, \tag{31}$$

whose matrix of coefficients has the value D for its determinant.

In terms of the known of Q1, Q2, Q3, K1, K2 and D, all of which are easily computed from the given data (xn, yn), the solution of the simultaneous equations (30) and (31) for the optimum values of U and V can be written as follows:

$$opt.U = \frac{(Q_2K_1 - Q_3K_2)}{D}, \tag{32}$$

$$opt.V = \frac{(Q_1K_1 - Q_3K_1)}{D}, \tag{33}$$

Once the optimum center (U, V) of the wafer has been determined, the optimum values of U and V are substituted back into equation (21) to determine the value that var(s) takes when it is minimized. This value is called "min var(s)." To facilitate this calculation, equation (21) can be simplified by substituting abbreviations (24)–(28) back into equation (21), but three additional abbreviations are also helpful in expanding the last term of equation (21). The abbreviations are:

$$X_4 = \frac{1}{N}\sum_{n=1}^{N}x_n^4, \tag{34}$$

$$Y_4 = \frac{1}{N}\sum_{n=1}^{N}y_n^4, \tag{35}$$

$$Z_4 = \frac{1}{N}\sum_{n=1}^{N}(x_n^2 y_n^2), \tag{36}$$

As a preliminary step in the indicated calculation, the abbreviations (24)–(28) permit equation (21) to be shortened in appearance, to:

$$\text{var}(s) = 4Q_1U^2 + 4Q_2V^2 + 8Q_3UV - \tag{37}$$
$$8K_1U - 8K_2V + \frac{1}{N}\sum_{n=1}^{N}[(x_n^2 + y_n^2) - (X_2 + Y_2)]^2$$

Then, the explicit summation that remains in equation (37) can be expanded, and simplified by the substitution of abbreviations (9)–(10) and (34)–(36) to yield:

$$\text{var}(s)=(X_4+Y_4+2Z)-(X_2+Y_2)^2+4Q_1U^2+4Q_2V^2+8Q_3UV-8K_1U-8K_2V \tag{38}$$

The minimum value for this variance can be determined by substituting the optimum values of U and V from equations (32) and (33) into the right-hand side of equation (38) to obtain the following formula:

$$\min \text{var}(s)=(X_4+Y_4+2Z_4)-(X_2+Y_2)^2-4/D(Q_1K_2^2+Q_2K_1^2-2Q_3K_1K_2) \tag{39}$$

Corresponding to this minimum possible variance of the sn values, the standard deviation of those values will take a minimum possible value called "Delta s" which is defined as the square-root of min var(s). Therefore, the smallest possible standard-deviation of the s values can be determined by the formula:

$$\Delta(s)=[(X_4+Y_4+2Z_4)-(X_2+Y_2)^2-4/D(Q_1K_2^2+Q_2K_1^2-2Q_3K_1K_2)]^{1/2} \quad (40)$$

At the same time that the optimum U and V values from equations (32) and (33) are used to compute the minimum possible variance of the s values via equation (38), those optimum values are also substituted for U and V on the right-hand side of equation (11) to compute a best value for S, the mean of the s values. Upon performing this substitution, and using abbreviations (24) and (25) to simplify the result, the following formula is obtained:

$$bestS=Q_1+Q_2+(X_1-opt.U)^2+(Y_1-opt.V)^2, \quad (41)$$

Corresponding to the best value determined for he mean squared-radius S under the present least squares (minimum s-variance) criterion, the radius "R" of a circle that best fits the N given points can be determined by following the form of equation (2):

$$(bestS)=R^2, \quad (42)$$

so $$R=(best\ S)^{1/2}, \quad (43)$$

or, according to equation (41)

$$R=[Q_1+Q_2+(X_1-opt.U)^2+(Y_1-opt.V)^2]^{1/2} \quad (44)$$

The linear precision Delta R that measures how well the best circle fits the N given points can be approximately determined by taking differentials in equation (42) and setting the differential of the left-hand side equal to the standard deviation delta s of equation (40). This yields:

$$\Delta s=2R\Delta R, \quad (45)$$

From this, it can be estimated that:

$$\Delta R=\Delta s/(2R) \quad (46)$$

The analytical results that have been obtained starting from the Cartesian coordinates (xn, yn) of the N given points can be broken down into three areas. Equations (32) and (33) specify the Cartesian coordinates (U, V) of the center of the circle that best fits the given points according to the least squares criterion used. Equation (44) specifies the radius, R, of the best fitting circle, and equation (46) gives a measure of the linear precision of fit, ΔR, which has the character of a standard deviation. The above determination of the center of the wafer can be repeated using different combinations of radial positions of the wafer edge.

Once the above calculations have been completed, the rotation and elevation positioning driver swings carriage 58 and hand 12a so as to align the radial direction of movement of the hand with the direction from axis 19 to the calculated center of the wafer. The computer then moves the hand 12 into engagement with the wafer, lifts the wafer off the chuck and moves the wafer in the radial direction through a distance corresponding to the calculated distance between the center of the wafer and axis 19. The hand 12 then lowers so as to place the wafer on the chuck 18 with the calculated center of the wafer aligned with the vertical axis 19.

Figure 5:
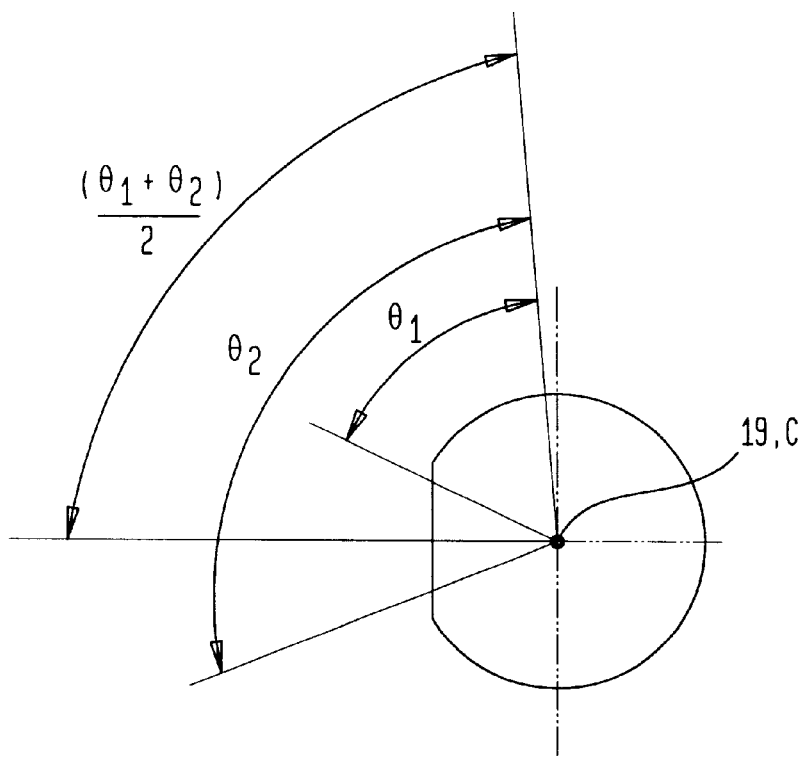
FIG. 5 is a diagram depicting a flat finding operation in the wafer handling robot of FIGS. 1–4.

Positioning the wafer centrally with respect to the axis allows the notch or largest flat to be found easily. The hand 12 is moved so as to position the associated sensor 20 radially inward of the circumferential edge of the wafer and carriage 58 is turned to a position at which the sensor is occluded. The carriage is then turned thereby rotating the hand and sensor about the axis 19 and hence about the center of the wafer (varying theta) until the sensor becomes not occluded. At this point, the computer records the circumferential position ($\theta_1$, FIG. 5). The rotation of the hand about axis 19 ("θ" movement) is then reversed and the hand 12 brought to a position at which the sensor is again occluded. The hand 12 continues to rotate in the reversed "θ" direction until the sensor again becomes not occluded. A second value of theta is recorded at this point ($\theta_2$, FIG. 5). The sum of the two values of theta divided by two to yield the rotational position of the center of the flat. Reversing the direction of rotation eliminates the effect of hysteresis in the rotational positioning system. The position arrived at is the center of the flat or notch. Once these operations have been performed, the position and orientation of the wafer in the frame of reference of the robot is known precisely. If desired, the robot can reorient the wafer to orient the flat in a desired direction, as by engaging the hand with the wafer, lifting the wafer from the chuck and turning the hand about the axis through an angle required to orient the flat in the desired orientation. The hand can also be actuated to move the wafer from the chuck and move it through a known distance, so as to deposit the wafer into a holder or wafer processing device. Because the wafer does not slip relative to the hand during movement, and because the position and orientation of the wafer at the start of such movement are known, the position and orientation of the wafer as deposited are also known.

The sequence of operations discussed above can be repeated over and over again, to thereby process a sequence of wafers. The second robot hand 12b may be used in the same way as discussed above, to place a second wafer on the chuck 18, determine the center and location of the notch or flat of the second wafer, and to discharge the wafer from the device. The hands can be used interchangeably. Thus, a wafer initially deposited by hand 12b can be measured, moved and/or discharged from the device using hand 12a.

Figure 6:
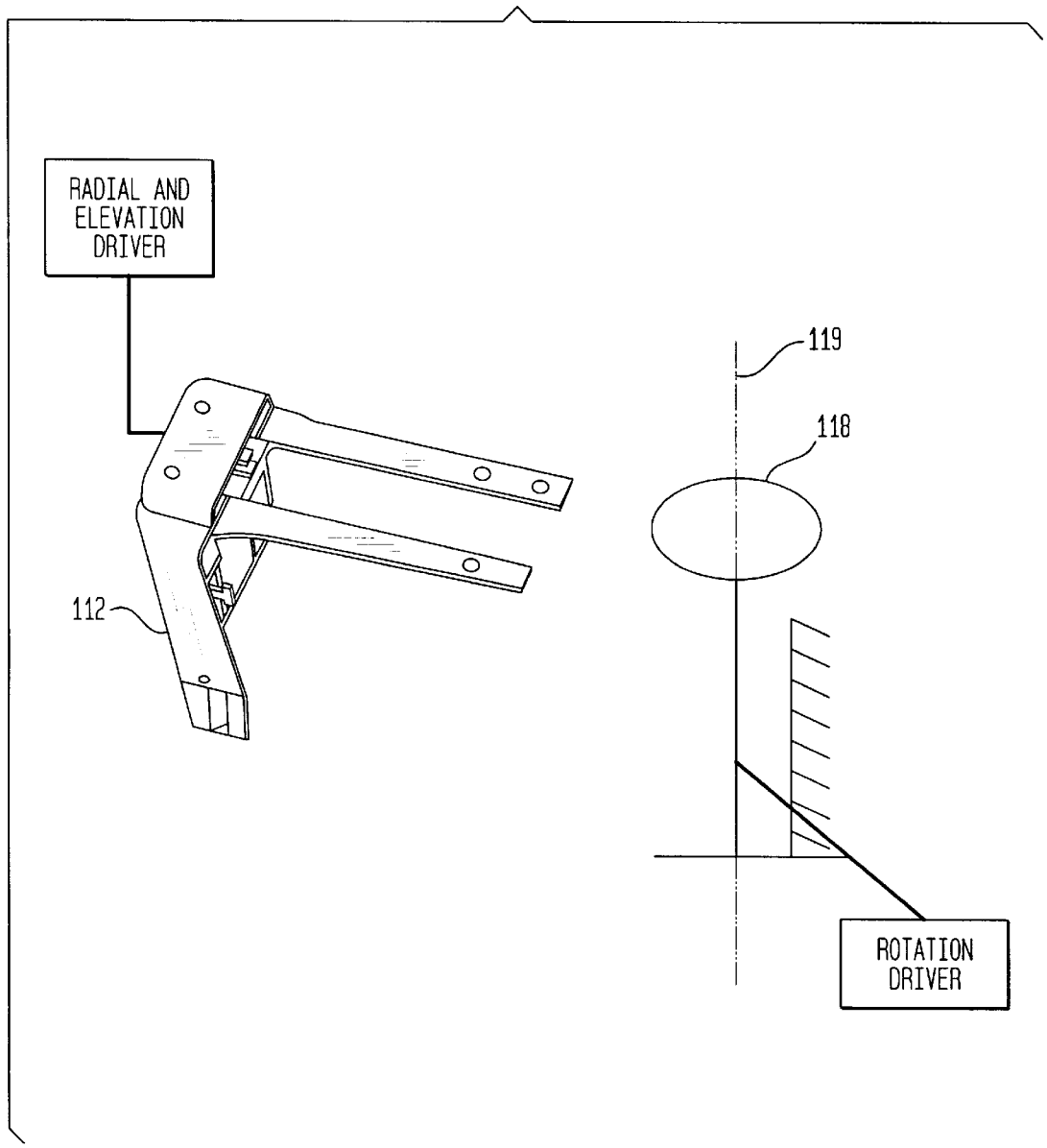
FIG. 6 is a diagrammatic view depicting a wafer handling robot in accordance with another embodiment of the invention.

In an alternate embodiment (See FIG. 6), the robot includes means for rotating the chuck 118 relative to the frame around the vertical axis 119 to thereby position the hand 112 at different circumferential positions relative to the chuck. Thus, the hand would not have to rotate about the axis of the chuck to determine the radial position of the edge of the wafer. This arrangement is less preferred.

In a further alternate embodiment, the robot includes means for moving the chuck up and down along the vertical axis. This eliminates the need for the robot hand to move along a vertical axis.

In a further alternate embodiment, the fingers of the hand may have elements disposed on it which can be raised or lowered. The movable elements may be located at the ends of the fingers remote from the base so that when the hand engages a wafer, the wafer rests upon the movable elements. Selectively actuatable devices such as fluid-actuated cylinders, solenoids or motor drives may be provided for moving the movable elements relative to the hand. When the hand moves to the chuck to deposit the wafer upon it, the wafer can be raised or lowered to the level of the chuck through raising or lowering the movable elements accordingly. This eliminates the need for the robot hand to move along a vertical axis and reduces the necessary degrees of freedom of the robot to two.

The various devices mentioned above for moving the hands and other elements of the apparatus, and for reporting the positions of these moving components to the computer, are merely illustrative. Numerous alternative moving and position reporting devices are well known to those skilled in the art. For example, servomotors linked to screw drives, rack and pinion drives, and cam mechanisms can be employed. Also, fluid powered devices such as pneumatic or hydraulic actuators can be used, although care should be taken to isolate the power fluid from the wafer environment. The position reporting devices need not be integral with the moving devices. For example, well known optical, magnetic or electromechanical position encoding and reporting units may be used. Similarly, the sensor on each hand used to detect the wafer edge need not be a photodetector, but may instead be a capacitive sensor, ultrasonic detector, pneumatic sensor or other form of non-contact sensor. Sensors which contact the wafer edge, such as electromechanical switches, can also be used but are less preferred because they may damage the edge of the wafer.

The methods can be varied. For example, more or less than six measurements can be used to find the center of the wafer. Also, in moving the hand radially to find the edge position at a given circumferential position, the hand can be moved inwardly and outwardly to take multiple measurements, which can be averaged with one another.

As these and other variations and combinations of the features discussed above can be used without departing from the invention as defined by the claims, the foregoing description of the preferred embodiments should be taken by way of illustration rather than by way of limitation of the invention defined by the claims.

What is claimed is:

1. A cylindrical coordinate robot for performing the task of centering and notch or flat finding of a wafer as well as the task of pre-alignment comprising:
   a. a frame;
   b. at least one hand operatively mounted to said frame;
   c. a chuck having a vertical axis mounted to said frame;
   d. means for moving at least one of said hand and said chuck relative to said frame so that said hand places a wafer on said chuck or removes a wafer from said chuck and so that said hand moves relative to said chuck in a circumferential direction around said vertical axis while a wafer is disposed on said chuck, said means for moving including means for moving said hand relative to said frame so that said hand orbits around said vertical axis while said chuck does not rotate around said vertical axis; and
   e. a sensor attached to said hand for detecting the radial position of the wafer edge at various circumferential positions about the vertical axis of the chuck, said robot using movement of said hand both for (1) placement or removal of the wafer and for (2) determining position of the wafer on the chuck.

2. The cylindrical coordinate robot of claim 1 wherein said means for moving includes means for moving said hand in radial directions towards or away from said vertical axis while said hand is in each of a plurality of circumferential positions relative to said chuck.

3. The cylindrical coordinate robot of claim 2 wherein said sensor includes a detector mounted to the hand at a detector location and operative to detect presence of an edge of the wafer at such detector location and providing an edge signal when the detector location is radially aligned with the edge, the apparatus further including means for tracking the radial position of the hand and determining the radial position of the edge based on the radial position of said hand when said edge signal is generated.

4. A cylindrical coordinate robot for performing the task of centering and notch or flat finding of a wafer as well as the task of pre-alignment comprising:
   a. a frame;
   b. at least one hand operatively mounted to said frame;
   c. a chuck having a vertical axis mounted to said frame;
   d. means for moving at least one of said hand and said chuck relative to said frame so that said hand places a wafer on said chuck or removes a wafer from said chuck and so that said hand moves relative to said chuck in a circumferential direction around said vertical axis while a wafer is disposed on said chuck, further including means for rotating said chuck relative to said frame around said vertical axis to thereby position said hand at different circumferential positions relative to said chuck and further including means for moving said hand in radial directions towards or away from said vertical axis while said hand is in each of a plurality of circumferential positions relative to said chuck; and
   e. a sensor attached to said hand for detecting the radial position of the wafer edge at various circumferential positions about the vertical axis of the chuck, said robot using movement of said hand both to place the wafer and to determine position of the wafer on the chuck.

5. The cylindrical coordinate robot of claim 4 wherein said sensor includes a detector mounted to the hand at a detector location and operative to detect presence of an edge of the wafer at such detector location and providing an edge signal when the detector location is radially aligned with the edge, the apparatus further including means for tracking the radial position of the hand and determining the radial position of the edge based on the radial position of said hand when said edge signal is generated.

6. The cylindrical coordinate robot of claim 1 or claim 4 wherein said robot further includes a calculating device for determining the center and the location of a flat or notch on the wafer from edge locations determined by said sensor.

7. The cylindrical coordinate robot of claim 1 or claim 4 wherein said hand comprises:
   a) a base; and
   b) at least two fingers attached to said base.

8. The cylindrical coordinate robot of claim 1 or claim 4 wherein said sensor detects the radial position of the wafer edge at 60° intervals.

9. The cylindrical coordinate robot of claim 1 or claim 4 wherein said sensor includes a Light Emitting Diode, Photo Transistor Couple.

10. A method of finding the center of a wafer comprising the steps of:
   a. using a robot hand to place the wafer on a chuck;
   b. detecting the radial position of the wafer edge at various circumferential positions about a vertical axis through a sensor disposed on the robot hand;
   c. calculating the location of the center of the wafer relative to the vertical axis based on said detected radial positions; and
   d. determining the location of a notch or flat of the wafer by using said sensor to detect edges of said wafer including positioning said sensor at a radial distance from said vertical axis and moving said sensor circumferentially around said vertical axis so that said sensor detects edges of the wafer and; using the hand to align the calculated center of the wafer with said vertical axis prior to said step of determining the location of the notch or flat of the wafer.

11. The method as claimed in claim 10 further comprising the step of determining the location of a notch or flat of the wafer by using said sensor to detect edges of said wafer.

12. The method as claimed in claim 11 further comprising the step of using the hand to align the calculated center of the wafer with said vertical axis prior to said step of determining the location of the notch or flat of the wafer.

13. The method as claimed in claim 10 further comprising the step of transporting the wafer away from said chuck to a desired location.

* * * * *

UNITED STATES PATENT AND TRADEMARK OFFICE
CERTIFICATE OF CORRECTION

PATENT NO. : 6,126,380
DATED : October 3, 2000
INVENTOR(S) : Hillman It is certified that error appears in the above-identified patent and that said Letters Patent is hereby corrected as shown below:

Col. 5, formulas 1, 2, 3 4, throughout the formulas, every subscript m (i.e., "$_m$") should read subscript n (i.e. -- $_n$ --).

Col. 6, formulas 17, 18, throughout the formulas, every subscript m (i.e., "$_m$") should read subscript n (i.e. -- $_n$ --).

Signed and Sealed this

Twenty-second Day of May, 2001

NICHOLAS P. GODICI

*Attest:*

*Attesting Officer*     *Acting Director of the United States Patent and Trademark Office*